United States Patent
Nofen et al.

(10) Patent No.: US 11,562,940 B2
(45) Date of Patent: Jan. 24, 2023

(54) INTEGRATED HEAT SPREADER COMPRISING A SILVER AND SINTERING SILVER LAYERED STRUCTURE

(71) Applicant: Intel Corporation, Santa Clara, CA (US)

(72) Inventors: Elizabeth Nofen, Phoenix, AZ (US); James C. Matayabas, Jr., Gilbert, AZ (US); Yawei Liang, Chandler, AZ (US); Yiqun Bai, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 808 days.

(21) Appl. No.: 16/296,898

(22) Filed: Mar. 8, 2019

(65) Prior Publication Data

US 2020/0286806 A1 Sep. 10, 2020

(51) Int. Cl.
*H01L 23/00* (2006.01)
*H01L 23/373* (2006.01)
*H01L 23/367* (2006.01)
*F28F 21/08* (2006.01)
*H01L 21/48* (2006.01)

(52) U.S. Cl.
CPC ........ *H01L 23/3735* (2013.01); *F28F 21/085* (2013.01); *F28F 21/089* (2013.01); *H01L 21/4882* (2013.01); *H01L 23/3675* (2013.01); *H01L 24/16* (2013.01); *H01L 2224/16227* (2013.01); *H01L 2924/1434* (2013.01)

(58) Field of Classification Search
CPC . H01L 23/3735; H01L 23/3675; H01L 24/16; H01L 2224/16227; H01L 2924/1434
See application file for complete search history.

(56) References Cited

U.S. PATENT DOCUMENTS

| 7,160,758 B2 * | 1/2007 | Fitzgerald | H01L 21/4871 257/E23.087 |
| 2008/0073776 A1 * | 3/2008 | Suh | H01L 23/3736 257/706 |
| 2013/0049204 A1 * | 2/2013 | Oeschler | H01L 23/3735 257/772 |
| 2014/0036338 A1 * | 2/2014 | Bareman | C03C 23/0025 359/267 |

FOREIGN PATENT DOCUMENTS

| CN | 103339729 A * | 10/2013 | ........... H01L 27/153 |
| EP | 2369422 A1 * | 9/2011 | ......... G03G 15/0865 |

* cited by examiner

*Primary Examiner* — Mohammad M Choudhry
(74) *Attorney, Agent, or Firm* — Essential Patents Group, LLP.

(57) ABSTRACT

An apparatus is provided which comprises: a die comprising an integrated circuit, a first material layer comprising a first metal, the first material layer on a surface of the die, and extending at least between opposite lateral sides of the die, a second material layer comprising a second metal over the first material layer, and a third material layer comprising silver particles and having a porosity greater than that of the second material layer, the third material layer between the first material layer and the second material layer. Other embodiments are also disclosed and claimed.

23 Claims, 7 Drawing Sheets

INTEGRATED HEAT SPREADER COMPRISING A SILVER AND SINTERING SILVER LAYERED STRUCTURE

BACKGROUND

As computing devices continue to get smaller and more powerful, thermal management solutions need to evolve to meet new challenges. Active thermal solutions, such as an electric fan, for example, are generally not feasible in a small system with very constrained dimensional requirements. Therefore, passive thermal solutions, including the use of highly thermally conductive material coupled with integrated circuit devices to dissipate heat, are necessary to prevent devices from overheating. While the power demands, and therefore heat generation, of systems continues to increase, critical temperature limits, which are not to be exceeded, in integrated circuit devices are generally unchanged at around 100 degrees Celsius.

Conventionally, solutions for passive thermal conduction for integrated circuit devices include a thermal interface material (TIM) between the die and a high thermal conductivity, generally metal, heat spreader or lid. However, even a solder TIM, which may have thermal conductivity of about 85 watts per meter-kelvin (W/m-K), may not have sufficiently high thermal conductivity to prevent overheating in devices that have high power demands. Therefore, there is a need for device packages with passive thermal solutions that can provide higher thermal conductivity while still preventing warpage and other reliability issues.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Integrated heat spreaders comprising a silver and sintering silver layered structure are presented. In this regard, embodiments of the present disclosure may enable thick bond lines of silver through diffusion bonding to a die and/or between multiple heat spreader layers. The high thermal conductivity (~400 W/m-K) of silver can be utilized while reliably securing the heat spreader to the die. This approach may enable higher power computing devices to dissipate heat effectively.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

Unless otherwise specified the use of the ordinal adjectives "first," "second," and "third," etc., to describe a common object, merely indicates that different instances of like objects are being referred to, and is not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

Figure 1:
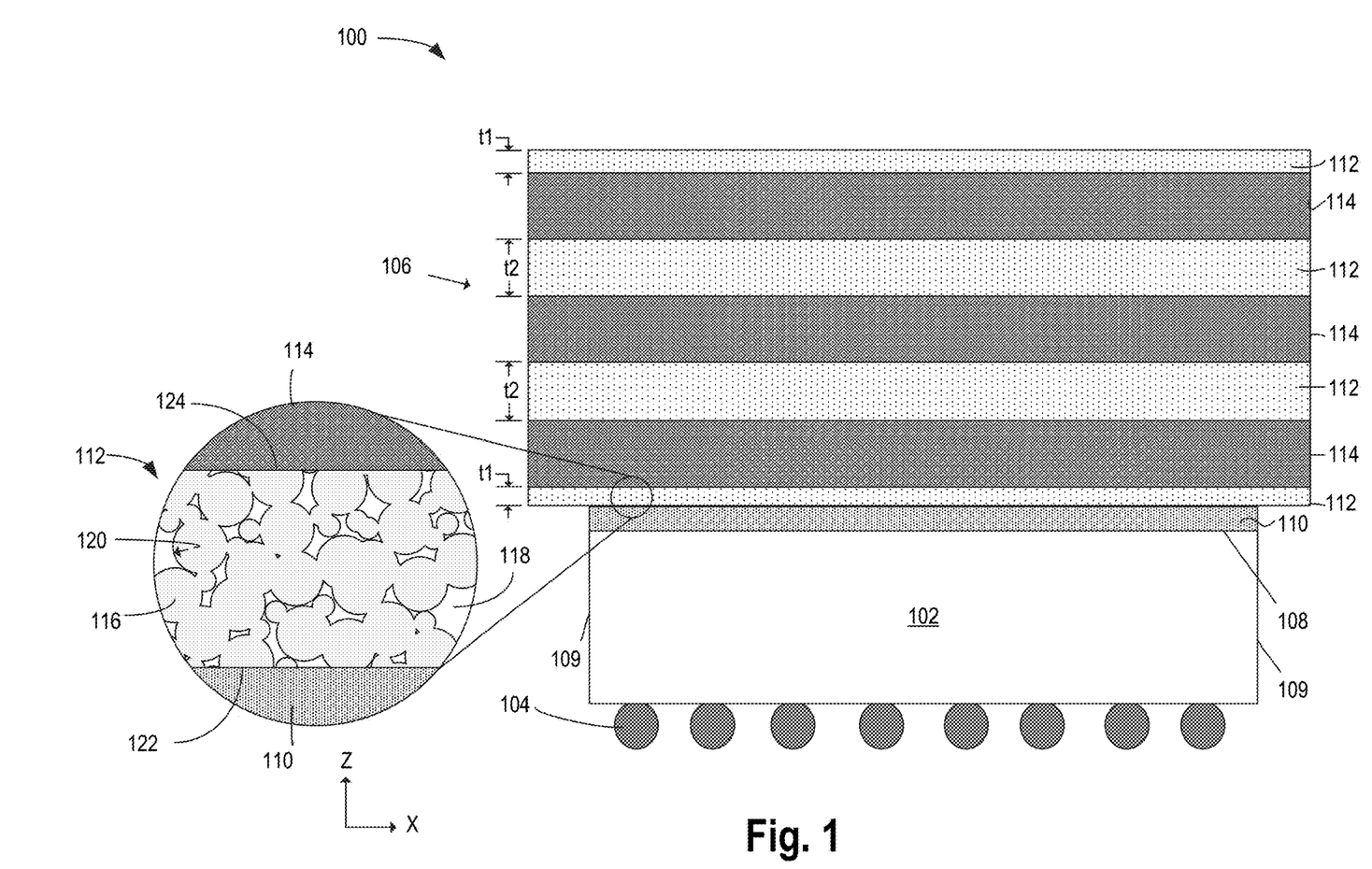
FIG. 1 illustrates a cross-sectional view of an example integrated heat spreader, according to some embodiments.

FIG. 1 illustrates a cross-sectional view of an example integrated heat spreader, according to some embodiments. As shown, device 100 includes an integrated circuit die 102. In some embodiments, device 100 is a computing or communication device. Device 100 may be integrated as part of any type of system, including, but not limited to, a personal computing, mobile, desktop, laptop, or server system. Integrated circuit die 102 may be any type of device including, but not limited to, a processor, a controller, a field programmable gate array (FPGA), etc.

Integrated circuit die 102 may be coupled to any suitable substrate (not depicted) through device contacts 104. Device contacts 104 may be any structures suitable for electrically coupling integrated circuit die 102 with a substrate. In some embodiments, device contacts 104 are solder features, such as, for example microbumps. On a side of circuit die 102 opposite device contacts 104 is die metallization 110. Die metallization 110 may advantageously bond readily with an overlying integrated heat spreader 106. Die metallization 110 may be a continuous sheet or layer of any suitable metal, or may be one or more patterned features of any suitable metal. In some embodiments, die metallization 110 extends between lateral sides 109 of integrated circuit die 102 and completely covers top die surface 108. In some embodiments, die metallization 110 is a metal that diffusion bonds readily with silver, including, but not limited to, gold, silver, copper, or alloys thereof.

In some embodiments, integrated heat spreader 106 is a stack of two or more material layers 112, 114 that may alternate for any number of total layers. In some embodiments, integrated heat spreader 106 is a stack-up of foil layers laminated with a sintering material. In some embodiments, integrated heat spreader 106 includes at least one silver foil layer laminated with a sintering material comprising silver. The sintering material may be applied to a foil layer as a dry film laminate, or as a paste, for example. In some embodiments, integrated heat spreader 106 has a total height of between 300 um and 1000 um. A preform layup such as integrated heat spreader 106 may be advantageous in that the inclusion of silver foil can enable facile fabrication and retention of thick (>100 um) bond line thickness with the modulus and ductility of silver while minimizing brittleness and cracking within the sintering silver layers by allowing for the use of smaller (<5 um) sintering silver particles. While shown as extending laterally (in the x-dimension) beyond die surface 108, in some embodiments, integrated heat spreader 106 has a same or similar width as integrated circuit die 102.

In some embodiments, material layers 112 include sinterable metal particles 116. In some embodiments, particles 116 are silver particles that are bonded together through sintering. In some embodiments, particles 116 are predominantly silver, but may include other metals or impurities. In some embodiments, particles 116 are >95% pure silver. In some embodiments, within material layers 112, pores 118 are interspersed with particles 116. Together with particles 116, pores 118 may constitute a porosity percentage of first material layers 112. In some embodiments, first material layers 112 have a porosity percentage of less than 50%. In some embodiments, first material layers 112 have a porosity percentage of between 1% and 30%. In some embodiments, pores 118 are voids, with porosity then translating to a void area %. In other embodiments, pores 118 may include other material, such as polymer resin, solvents, or stabilizers, for example, interspersed among particles 116. In some embodiments, surfaces of particles 116 may have a prevalently reoccurring radius of curvature 120 consistent with spherical particles that have been bonded together. In some embodiments, radius of curvature 120 is less than 3 um. In some embodiments, radius of curvature 120 is between 0.5 um and 2.5 um.

In some embodiments, material layer 112 may have a first thickness t1 on a top and/or bottom layer of integrated heat spreader 106 and a second, larger thickness t2 in internal layers of integrated heat spreader 106. In some embodiments, thickness t2 is twice thickness t1, for example, where material layers 114 are laminated on both sides with material layer 112 and stacked up with additional laminated material layers 114 to form integrated heat spreader 106. In some embodiments, thickness t1 has a range of between 10 um and 30 um. In some embodiments, thickness t2 has a range of between 20 um and 60 um. While shown as including four material layers 112, integrated heat spreader 106 may include any number of material layers 112.

In some embodiments, material layers 114 are solid metal. In some embodiments, second material layers 114 have a polycrystalline structure with no visible pores. In some embodiments, second material layers 114 have a porosity percentage of <1%. In some embodiments, material layers 114 are predominantly silver, but may include other metals or impurities. In some embodiments, second material layers 114 are >95% pure silver. While shown as including three material layers 114, integrated heat spreader 106 may include any number of material layers 114. While shown as having similar thicknesses, in some embodiments, material layers 114 may vary in thickness. In some embodiments, material layers 114 have thicknesses in a range of between 50 um and 300 um.

FIG. 1 further illustrates metallurgic junctions 122 and 124 where there is a diffusion bond of material layer 112 with die metallization 110 and with second material layer 114, respectively. In a diffusion bond, atoms from particles 116 have diffused into the crystalline structure of die metallization 110, and second material layer 114 along metallurgic junctions 122 and 124, respectively. Atoms of die metallization 110, and second material layer 114 may likewise have diffused into particles 116. In some embodiments where die metallization 110 is gold, for example, some gold atoms may be detectable in first material layer 112 and some silver atoms may be detectable in die metallization 110, with concentrations of each declining with distance from metallurgical junction 124, for example according to Fick's diffusion laws.

Figure 2:
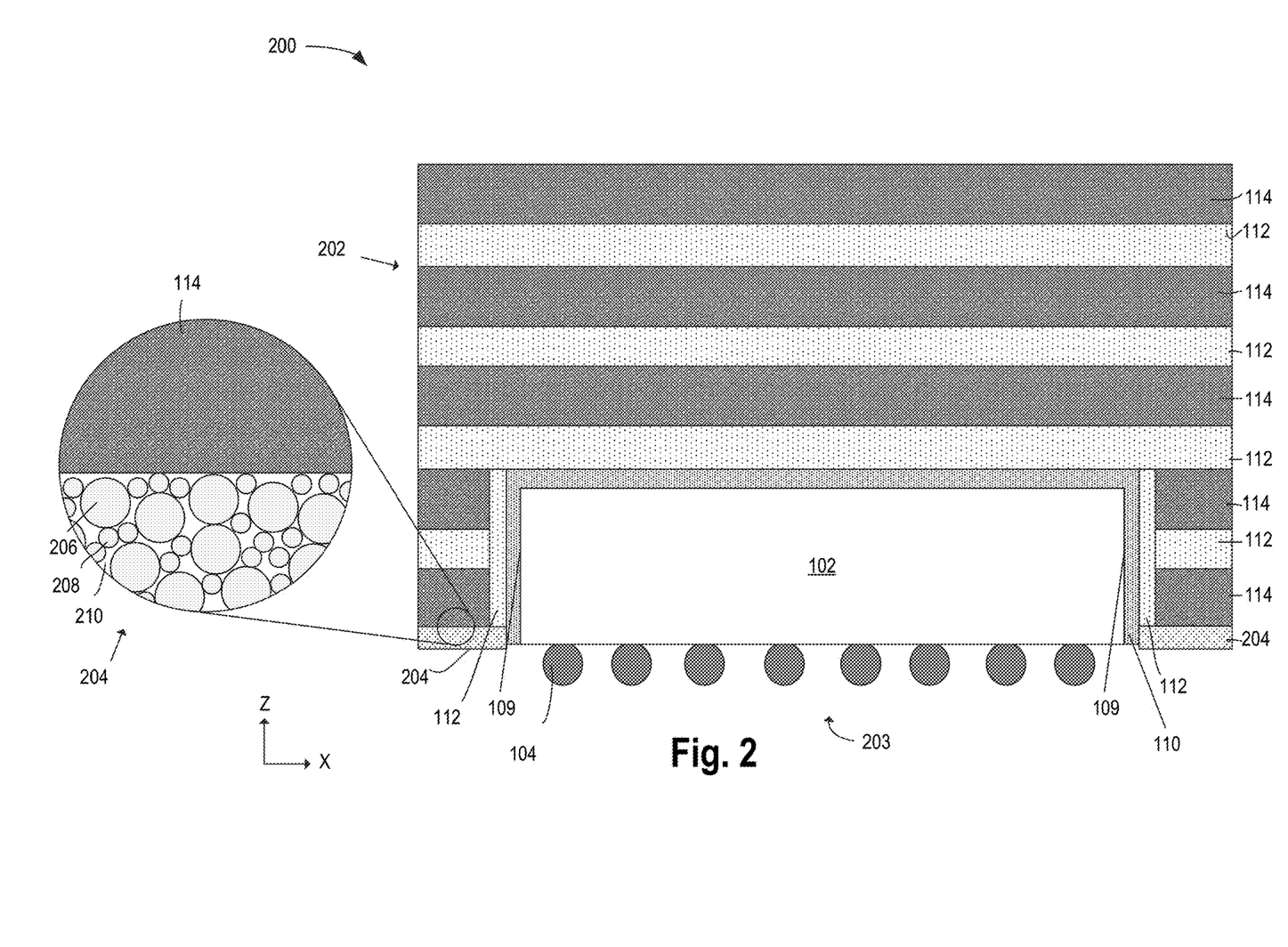
FIG. 2 illustrates a cross-sectional view of an example integrated heat spreader, according to some embodiments.

FIG. 2 illustrates a cross-sectional view of an example integrated heat spreader, according to some embodiments. As shown, device 200 includes integrated circuit die 102, device contacts 104, integrated heat spreader 202, die metallization 110, material layers 112, material layers 114, substantially as described above.

In some embodiments, integrated heat spreader 202 includes alternating layers of material layers 112 and material layers 114 not only above integrated circuit die 102, but also along lateral sides 109 of integrated circuit die 102. In some embodiments, integrated heat spreader 202 may include a central cavity 203 embedded within alternating layers of first material layers 112 and second material layers 114 and having dimensions to accept integrated circuit die 102. In some embodiments, one or more of material layers 112 and/or material layers 114 are bonded along lateral sides with material layers 112 along lateral sides 109 of integrated circuit die 102.

In some embodiments, die metallization 110 is conformal along a top and lateral sides 109 of integrated circuit die 102, substantially as illustrated. In some embodiments, at least one material layer 112 is perpendicular with the material layers 114 of integrated heat spreader 202. This layer of sintering material may then share a metallurgic junction with die metallization 110 adjacent to sidewall surfaces reference number.

In some embodiments, material layer 204 also includes sintering particles, which may be silver, for example. While not drawn to scale, in some embodiments, material layer 204 may include a combination of micro-sized (larger particles 206) and nano-sized (smaller particles 208) sintering particles. In some embodiments, particles 206 have a diameter in the range of 1 um to 5 um. In some embodiments, particles 208 have a diameter in the range of 20 nm to 200 nm. In some embodiments, pores 210 are interspersed with particles 206 and 208. Together with particles 206 and 208, pores 210 may be characterized by a porosity percentage of material layer 204. In some embodiments, material layer 204 has a porosity percentage of less than 50%. In some embodiments, third material layer 204 has a porosity percentage of between 20% and 40%. In some embodiments, pores 210 may be voids, while in other embodiments, pores 210 may include other material, such as polymer resin, solvents, or stabilizers, for example, interspersed among particles 206 and 208. In some embodiments, after sintering, material layer 204 shares metallurgic junctions with adjacent metal surfaces.

Figure 3:
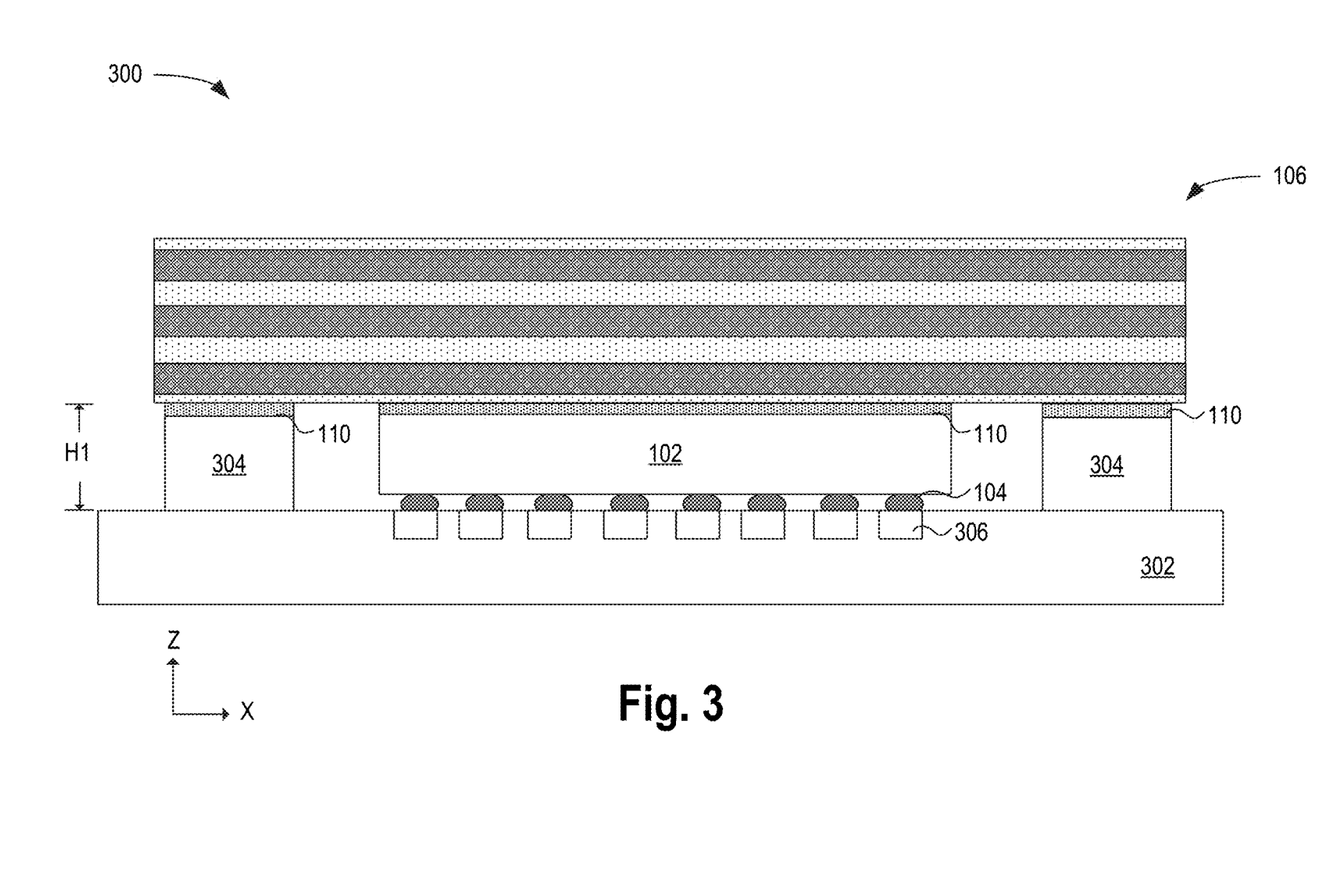
FIG. 3 illustrates a cross-sectional view of an example integrated circuit device package with an example integrated heat spreader, according to some embodiments.

FIG. 3 illustrates a cross-sectional view of an example integrated circuit device package with an example integrated heat spreader, according to some embodiments. As shown, package 300 includes integrated circuit die 102, device contacts 104, integrated heat spreader 106, metallization 110, package substrate 302, supports 304, and conductive contacts 306. In some embodiments, package 300 is a computing or communication device. Package 300 may be integrated as part of any type of system, including, but not limited to, a personal computing, mobile, desktop, laptop, or server system.

In some embodiments, package substrate 302 includes conductive routing insulated with a dielectric material, such as an epoxy, to conductively couple device contacts 104 to other components of a system through conductive contacts 306.

In some embodiments, supports 304 are present on a surface of package substrate 302, for example to bond with, and provide mechanical stiffening to, integrated heat spreader 106. In some embodiments, supports 304 may be a thermally conductive material to further dissipate heat from integrated circuit die 102. In some embodiments, supports 304 extend z-height H1 substantially equal to that of integrated circuit die 102. In some embodiments, metallization 110 over supports 304 is coplanar with metallization 110 over integrated circuit die 102. In some embodiments, supports 304 are a cured polymer resin that may extend below a surface of package substrate 302. In some embodiments, supports 304 may include metal plating, such as metallization 110 to a greater extent than on a surface, as shown. In some embodiments, metallization 110 is greater than 50% of height H1 of supports 304.

Figure 4:
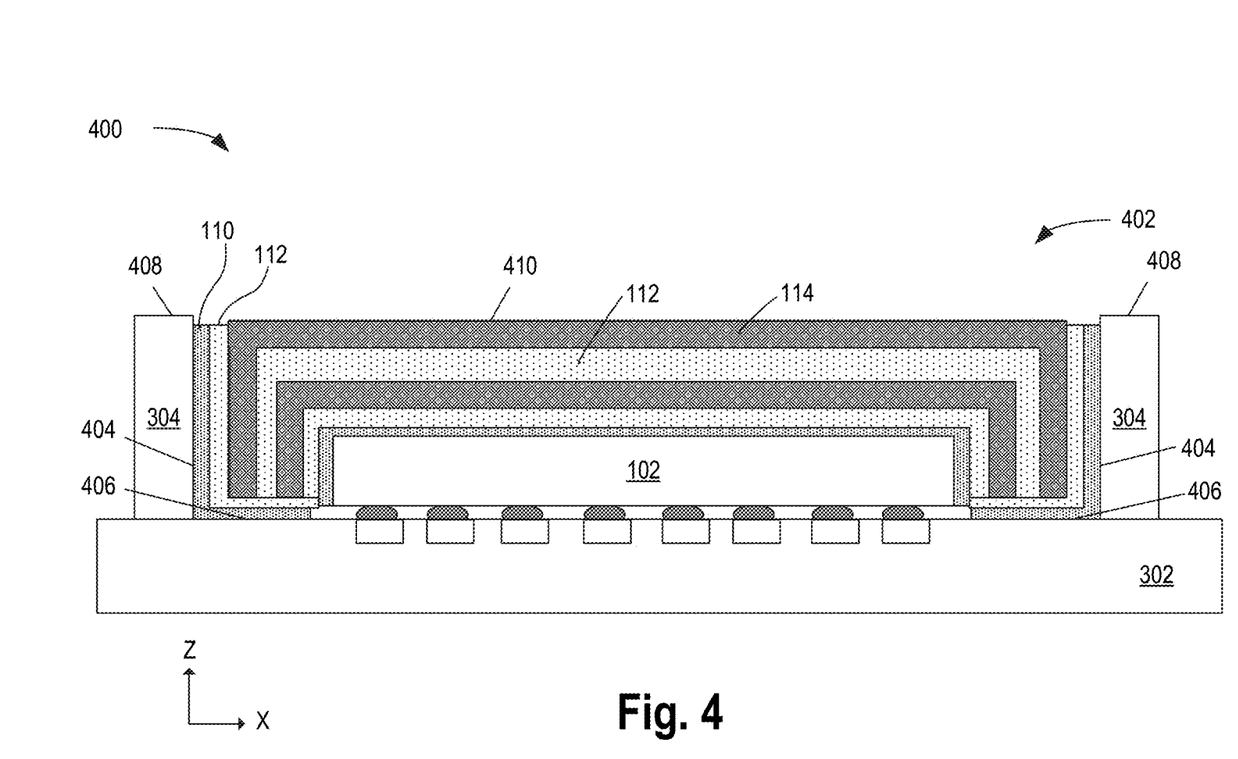
FIG. 4 illustrates a cross-sectional view of an example integrated circuit device package with an example integrated heat spreader, according to some embodiments.

FIG. 4 illustrates a cross-sectional view of an example integrated circuit device package with an example integrated heat spreader, according to some embodiments. As shown, package 400 includes integrated circuit die 102, integrated heat spreader 402, metallization 110, first material layers 112, second material layers 114, package substrate 302, and supports 304. In some embodiments, package 400 is a computing or communication device. Package 400 may be integrated as part of any type of system, including, but not limited to, a personal computing, mobile, desktop, laptop, or server system.

In some embodiments, integrated heat spreader 402 includes material layers 112 and material layers 114 that to are conformal to sidewall surfaces of integrated circuit die 102. In some embodiments, an advantage of a multi-layer integrated heat spreader with alternating thin layers of silver foil and sintering silver, such as integrated heat spreader 402, is the ductility to emboss the stack with integrated circuit die 102 without suffering a fracture.

In some embodiments, metallization 110 is present on side surfaces 404 of supports 304 and portions of a surface 406 of package substrate 302. In some embodiments, where metallization 110 is present, there is a metallurgic junction between metallization 110 and material layer 112. In some embodiments, an advantage of bonding first material layers 112 with metallization 110 on a surface of package substrate 302 and/or on supports 304 is a reduced risk of warpage and greater reliability. In some embodiments, an upper surface 408 of supports 304 away from package substrate 302 is coplanar with an upper surface 410 of integrated heat spreader 402, while in other embodiments, supports 304 may have a height (in the z-dimension) less than that of integrated heat spreader 402.

Figure 5:
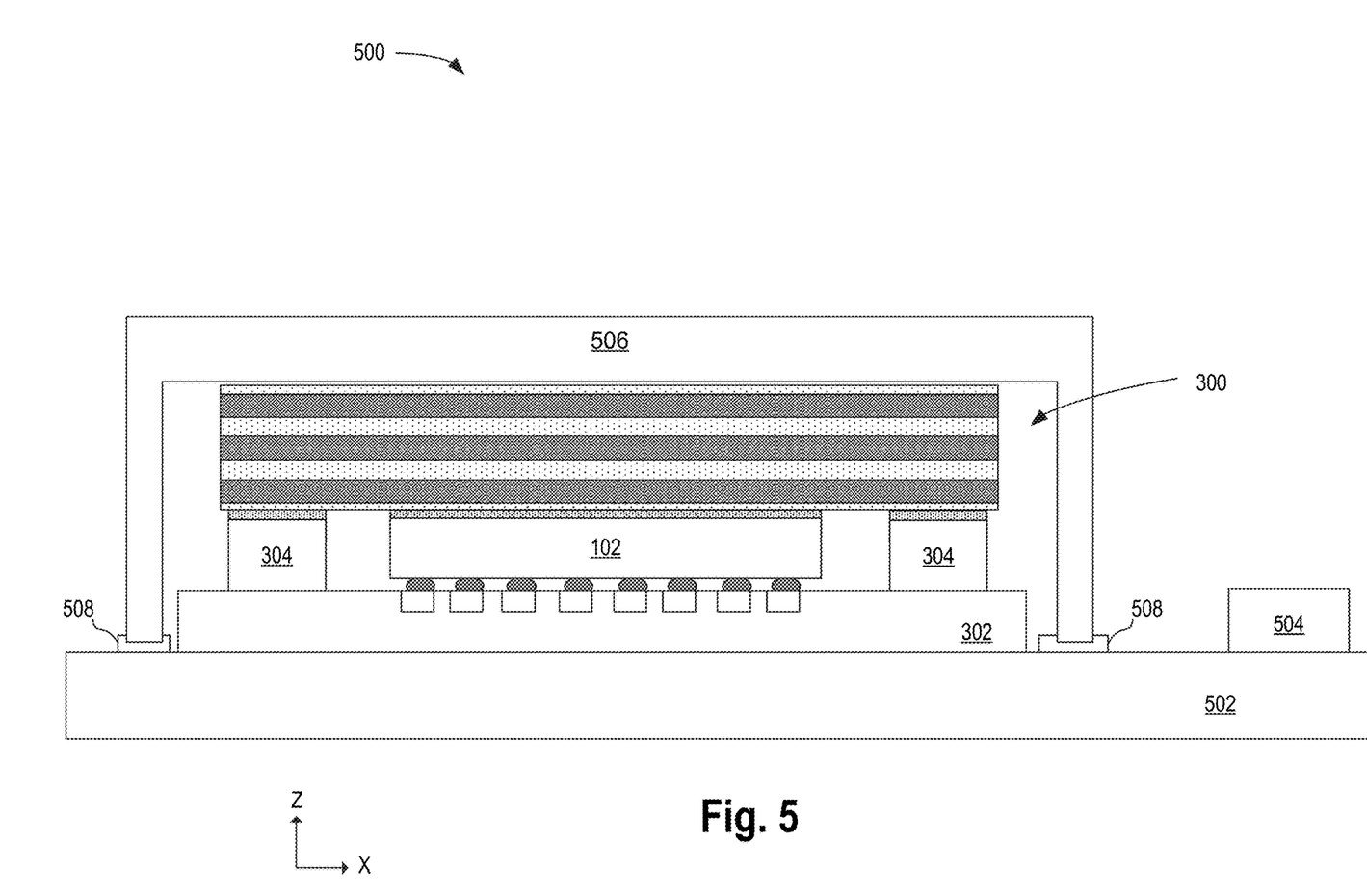
FIG. 5 illustrates a cross-sectional view of an example system with an integrated circuit device package with an example integrated heat spreader, according to some embodiments.

FIG. 5 illustrates a cross-sectional view of an example system with an integrated circuit device package with an example integrated heat spreader, according to some embodiments. As shown, system 500 includes package 300, system substrate 502, component 504, and lid 506. In some embodiments, system 500 may be any type of system, including, but not limited to, a personal computing, mobile, desktop, laptop, or server system.

In some embodiments, system substrate 502 may be a multi-layer fiberglass motherboard and includes routing and components not shown to provide power, inputs, and outputs, for example. In some embodiments, component 504 is a memory device, such as a dynamic or a static random access memory, or other system component, such as a controller, processor, or logic device, that is communicatively coupled with integrated circuit die 102.

Lid 506 may be a metal or other thermally conductive solid material to spread heat from package 300. Lid 506 may include fins (not shown) and may include adhesive or fasteners to further secure lid 506 to system substrate 502. In some embodiments, lid 506 may be a plate or block of material having high thermal conductivity, such as copper, aluminum, or diamond. In some embodiments, composite materials may be used for lid 506, such as the metal matrix composites (MMCs) copper-tungsten, AlSiC (silicon carbide in aluminium matrix), Dymalloy (diamond in copper-silver alloy matrix), and E-Material (beryllium oxide in beryllium matrix) In some further embodiments, lid 506 is bonded to a top material layer 112 of an integrated heat spreader. A metallurgical junction may therefore also be present between a metal of lid 506 (e.g., a surface finish of Ni) and sintering particles (e.g., silver) of material layer 112.

Figure 6:
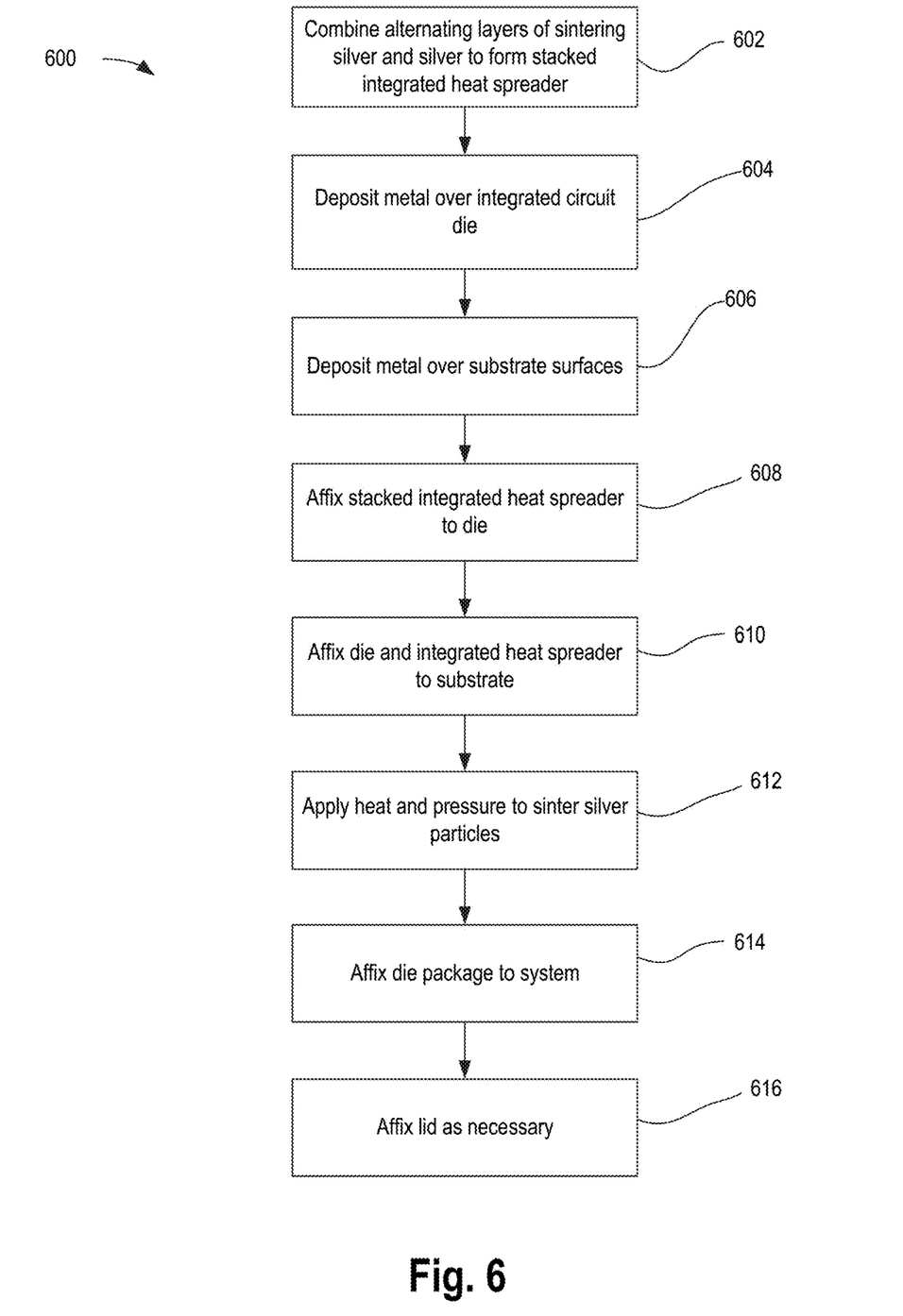
FIG. 6 illustrates a flowchart of a method of forming an example system with an integrated circuit device package with an example integrated heat spreader, in accordance with some embodiments.

FIG. 6 illustrates a flowchart of a method of forming an example system with an integrated circuit device package with an example integrated heat spreader, in accordance with some embodiments. Although the blocks in the flowchart with reference to FIG. 6 are shown in a particular order, the order of the actions can be modified. Thus, the illustrated embodiments can be performed in a different order, and some actions/blocks may be performed in parallel. Some of the blocks and/or operations listed in FIG. 6 are optional in accordance with certain embodiments. The numbering of the blocks presented is for the sake of clarity and is not intended to prescribe an order of operations in which the various blocks must occur. Additionally, operations from the various flows may be utilized in a variety of combinations.

Method 600 begins with combining (602) alternating layers of a sintering metal and a metal foil to form a stacked integrated heat spreader. In some embodiments, sintering paste (e.g., comprising silver particles) is applied to one or both sides of a foil layer (e.g., material layer 114 of FIG. 1) having a desired thickness (for example 100 um). The sintering material may be at least partially cured to facilitate B-staging a layup as a preform. In some embodiments, multiple layers of silver foil with sintering silver on both sides of each foil may be laminated to form an integrated heat spreader, such as integrated heat spreader 106. In some embodiments, multiple layers of silver foil with sintering silver on one side may be laminated to form an integrated heat spreader, such as integrated heat spreader 202 (FIG. 2). Returning to FIG. 6, metal may be deposited (604) over an integrated circuit die. In some embodiments, gold or silver or copper is deposited on an upper surface of an integrated circuit die by any known method, including, but not limited to, sputtering, plating, or spraying. In some embodiments, metallization, such as metallization 110 (FIG. 2) is conformally deposited on an upper and sidewall surfaces of an integrated circuit die.

Returning to FIG. 6, metal may be further deposited (606) over substrate surfaces. In some embodiments, metallization is formed over a surface of supports 304, such as in package 300. In some embodiments, metallization is formed on a package substrate surface and on sidewall surfaces of supports 304, such as in package 400 (FIG. 4). Continuing with FIG. 6, the stacked integrated heat spreader is affixed (608) to the die. In some embodiments, integrated circuit die 102 may be placed into a cavity of an integrated heat spreader, such as integrated heat spreader 202 (FIG. 2). In some embodiments, extensions of an integrated heat spreader may be stamped or embossed to contact sides of an integrated circuit die, such as heat spreader 402 (FIG. 4).

The method 600 (FIG. 6) continues with affixing (610) the die and integrated heat spreader assembly to the substrate. In some embodiments, integrated circuit die contacts may be affixed to conductive contacts on a package substrate by soldering or any other known method. In some embodiments, the integrated heat spreader may be placed in contact with supports 304 (FIG. 3). Continuing with FIG. 6, heat and pressure may be applied (612) to sinter silver particles. In some embodiments, a temperature of around 250 degrees Celsius, and a pressure of about 3 megapascals may be applied to sinter the sintering particles in material layers 112 and create diffusion bonds, such as metallurgic junctions 122 and 124 (FIG. 1).

Completing methods 600, the die package may be affixed (614) to a system. In some embodiments, package 300 may be affixed to system board 502 by any known method, including, but not limited to, soldering. Finally, a lid may be affixed (616) over the integrated heat spreader. In some embodiments, lid 506 (FIG. 5) may contact integrated heat spreader 106 and be adhered to system board 502 by any known method, such as adhesive.

Figure 7:
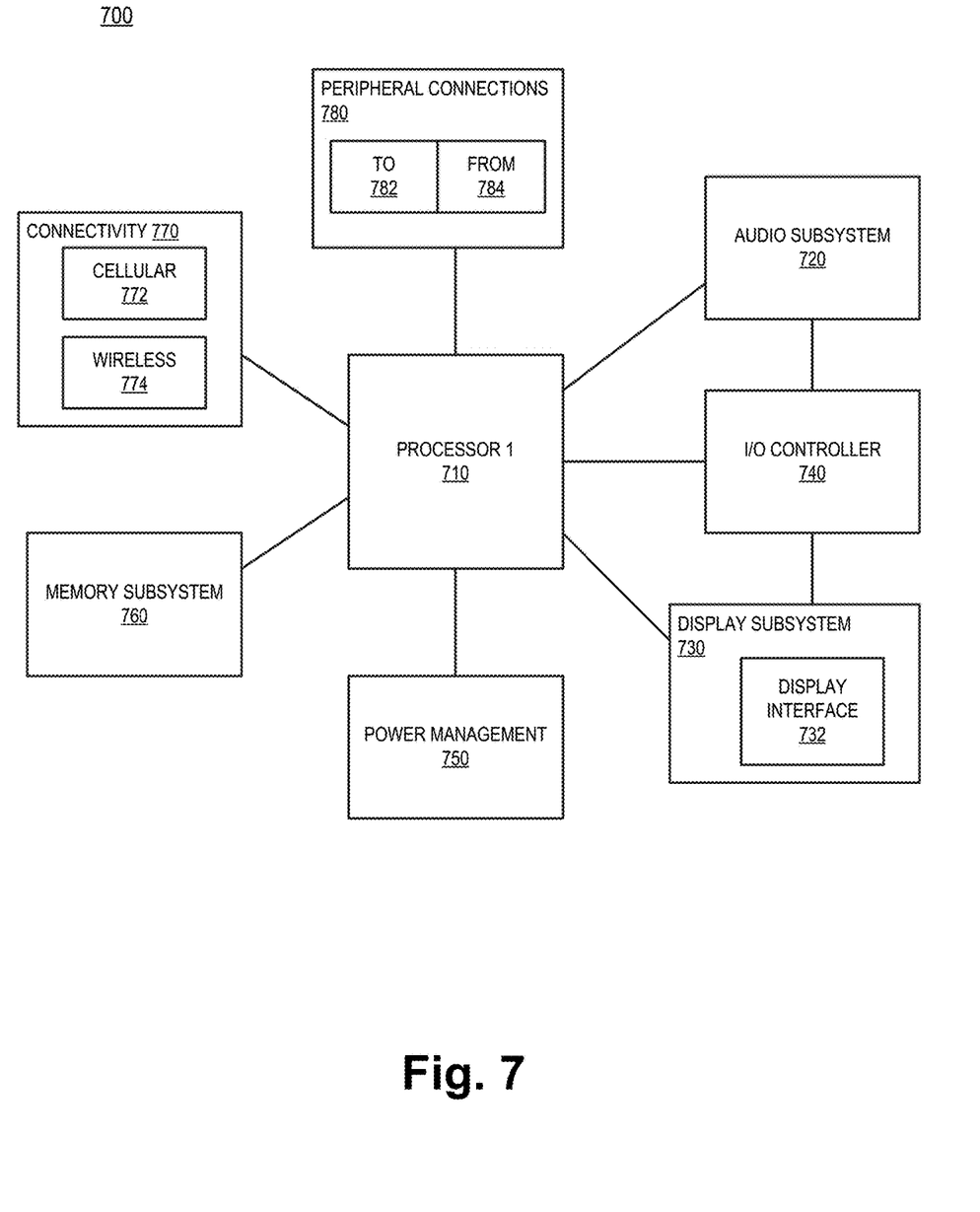
FIG. 7 illustrates a smart device or a computer system or a SoC (System-on-Chip) which includes an integrated circuit device package with an example integrated heat spreader, according to some embodiments.

FIG. 7 illustrates a smart device or a computer system or a SoC (System-on-Chip) which includes an integrated circuit device package with an example integrated heat spreader, according to some embodiments. In some embodiments, computing device 700 represents a mobile computing device, such as a computing tablet, a mobile phone or smart-phone, a wireless-enabled e-reader, or other wireless mobile device. It will be understood that certain components are shown generally, and not all components of such a device are shown in computing device 700. In some embodiments, one or more components of computing device 700, for example processor 710 and/or connectivity 770, include a package with an integrated heat spreader as described above.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure.

In some embodiments, computing device 700 includes a first processor 710. The various embodiments of the present disclosure may also comprise a network interface within 770 such as a wireless interface so that a system embodiment may be incorporated into a wireless device, for example, cell phone or personal digital assistant.

In one embodiment, processor 710 can include one or more physical devices, such as microprocessors, application processors, microcontrollers, programmable logic devices, or other processing means. The processing operations performed by processor 710 include the execution of an operating platform or operating system on which applications and/or device functions are executed. The processing operations include operations related to I/O (input/output) with a human user or with other devices, operations related to power management, and/or operations related to connecting the computing device 700 to another device. The processing operations may also include operations related to audio I/O and/or display M.

In one embodiment, computing device 700 includes audio subsystem 720, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 700, or connected to the computing device 700. In one embodiment, a user interacts with the computing device 700 by providing audio commands that are received and processed by processor 710.

Display subsystem 730 represents hardware (e.g., display devices) and software (e.g., drivers) components that provide a visual and/or tactile display for a user to interact with the computing device 700. Display subsystem 730 includes display interface 732, which includes the particular screen or hardware device used to provide a display to a user. In one embodiment, display interface 732 includes logic separate from processor 710 to perform at least some processing related to the display. In one embodiment, display subsystem 730 includes a touch screen (or touch pad) device that provides both output and input to a user.

I/O controller 740 represents hardware devices and software components related to interaction with a user. I/O controller 740 is operable to manage hardware that is part of audio subsystem 720 and/or display subsystem 730. Additionally, I/O controller 740 illustrates a connection point for additional devices that connect to computing device 700 through which a user might interact with the system. For example, devices that can be attached to the computing device 700 might include microphone devices, speaker or stereo systems, video systems or other display devices, keyboard or keypad devices, or other I/O devices for use with specific applications such as card readers or other devices.

As mentioned above, I/O controller 740 can interact with audio subsystem 720 and/or display subsystem 730. For example, input through a microphone or other audio device can provide input or commands for one or more applications or functions of the computing device 700. Additionally, audio output can be provided instead of, or in addition to display output. In another example, if display subsystem 730 includes a touch screen, the display device also acts as an input device, which can be at least partially managed by I/O controller 740. There can also be additional buttons or switches on the computing device 700 to provide I/O functions managed by I/O controller 740.

In one embodiment, I/O controller 740 manages devices such as accelerometers, cameras, light sensors or other environmental sensors, or other hardware that can be included in the computing device 700. The input can be part of direct user interaction, as well as providing environmental input to the system to influence its operations (such as filtering for noise, adjusting displays for brightness detection, applying a flash for a camera, or other features).

In one embodiment, computing device 700 includes power management 750 that manages battery power usage, charging of the battery, and features related to power saving operation. Memory subsystem 760 includes memory devices for storing information in computing device 700. Memory can include nonvolatile (state does not change if power to the memory device is interrupted) and/or volatile (state is indeterminate if power to the memory device is interrupted) memory devices. Memory subsystem 760 can store application data, user data, music, photos, documents, or other data, as well as system data (whether long-term or temporary) related to the execution of the applications and functions of the computing device 700.

Elements of embodiments are also provided as a machine-readable medium (e.g., memory 760) for storing the computer-executable instructions. The machine-readable medium (e.g., memory 760) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 770 includes hardware devices (e.g., wireless and/or wired connectors and communication hardware) and software components (e.g., drivers, protocol stacks) to enable the computing device 700 to communicate with external devices. The computing device 700 could be separate devices, such as other computing devices, wireless access points or base stations, as well as peripherals such as headsets, printers, or other devices.

Connectivity 770 can include multiple different types of connectivity. To generalize, the computing device 700 is illustrated with cellular connectivity 772 and wireless connectivity 774. Cellular connectivity 772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 774 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 780 include hardware interfaces and connectors, as well as software components (e.g., drivers, protocol stacks) to make peripheral connections. It will be understood that the computing device 700 could both be a peripheral device ("to" 782) to other computing devices, as well as have peripheral devices ("from" 784) connected to it. The computing device 700 commonly has a "docking" connector to connect to other computing devices for purposes such as managing (e.g., downloading and/or uploading, changing, synchronizing) content on computing device 700. Additionally, a docking connector can allow computing device 700 to connect to certain peripherals that allow the computing device 700 to control content output, for example, to audiovisual or other systems.

In addition to a proprietary docking connector or other proprietary connection hardware, the computing device 700 can make peripheral connections 780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

In first examples, an integrated circuit device apparatus comprises a die comprising an integrated circuit; a first material layer comprising a first metal, the first material layer on a surface of the die, and extending at least between opposite lateral sides of the die; a second material layer comprising a second metal over the first material layer; and a third material layer comprising silver particles and having a porosity greater than that of the second material layer, the third material layer between the first material layer and the second material layer.

In second examples, for any of the first examples, there is a metallurgical junction between a first of the silver particles and the first metal, or between a second of the silver particles and the second metal.

In third examples, for any of the first examples, the third material layer has a porosity exceeding 20%.

In forth examples, for any of the first examples, the silver particles have a diameter less than 5 micrometers.

In fifth examples, for any of the first examples, the third material layer comprises polymer resin interspersed among the silver particles.

In sixth examples, for any of the first examples, the first material comprises at least one of silver, gold, or copper.

In seventh examples, for any of the first examples, the second material layer comprises predominantly silver.

In eighth examples, for any of the first examples, the second and third materials extend laterally beyond the opposite lateral sides of the die.

In ninth examples, for any of the first examples, the second and third material layers comprise two adjacent layers of a stack, the stack further comprises: one or more additional second material layers, each comprising the second metal; and each interleaved with additional third material layers, each of the additional third material layers comprising silver particles and having higher porosity than the second material layers.

In tenth examples, for any of the ninth examples, one of the additional third material layers is at a top of the stack opposite the first material layer.

In eleventh examples, for any of the ninth examples, a first of the additional third material layers between the additional second material layers has a first thickness, greater than a second thickness of the third material layer between the first and second material layers.

In twelfth examples, for any of the eleventh examples, a thickness of the stack is between 300 um and 1000 um.

In thirteenth examples, for any of the eleventh examples, a thickness of each layer of the third material is between 15 um and 50 um.

In fourteenth examples, for any of the eleventh examples, a thickness of each layer of the second material is between 50 um and 300 um.

In fifteenth examples, an integrated circuit device package comprises a package substrate; an integrated circuit die coupled with contacts on a surface of the package substrate; a first material layer comprising a first metal, the first material layer on a surface of the die, and extending at least between opposite lateral sides of the die; a second material layer comprising a second metal over the first material layer; and a third material layer comprising silver particles and having a porosity greater than that of the second material layer, the third material layer between the first material layer and the second material layer, wherein there is a metallurgical junction between a first of the silver particles and the first metal, or between a second of the silver particles and the second metal.

In sixteenth examples, for any of the fifteenth examples, the first material layer extending conformally on the lateral sides of the die.

In seventeenth examples, for any of the fifteenth examples, a fourth material layer comprising the first metal on the surface of the package substrate, wherein there is a metallurgical junction between a third of the silver particles and the first metal of the fourth material layer.

In eighteenth examples, for any of the fifteenth examples, the package substrate further comprises one or more supports extending orthogonally away from the surface of the package substrate, wherein a surface of the one or more supports comprises the first metal.

In nineteenth examples, for any of the eighteenth examples, the one or more supports extend away from the surface of the package substrate beyond the surface of the die.

In twentieth examples, a computing system comprises a system board; a memory coupled with the system board; and an integrated circuit device package coupled with the system board, the integrated circuit device package comprises: a package substrate; an integrated circuit device coupled with contacts on a surface of the package substrate; a first material layer comprising a first metal, the first material layer on a surface of the die, and extending at least between opposite lateral sides of the die; and an integrated heat spreader, the integrated heat spreader comprises: a second material layer comprising a second metal over the first material layer; and a third material layer comprising silver particles and having a porosity greater than that of the second material layer, the third material layer between the first material layer and the second material layer, wherein there are metallurgical junctions between a first of the silver particles and the first metal and between a second of the silver particles and the second metal.

In twenty-first examples, for any of the twentieth examples, a fourth material layer comprising the first metal on the surface of the package substrate, wherein there is a metallurgical junction between a third of the silver particles and the first metal of the fourth material layer.

In twenty-second examples, for any of the twentieth examples, a fourth material layer comprising the first metal on the surface of the package substrate, wherein there is a metallurgical junction between a third of the silver particles and the first metal of the fourth material layer.

In twenty-third examples, for any of the twentieth examples, the package substrate further comprises one or more supports extending orthogonally away from the surface of the package substrate, wherein a surface of the one or more supports comprises the first metal.

In twenty-fourth examples, for any of the twentieth examples, a lid over the die and the integrated heat spreader, the lid adhered to the system board.

In twenty-fifth examples, a method of manufacturing an integrated circuit device package comprises: depositing a first metal on a surface of an integrated circuit die; depositing a second metal over the first metal; depositing a third metal between the first metal and the second metal, wherein the third metal comprises a sintering silver; and sintering the third metal to form a metallurgic junction between the first metal and the third metal.

In twenty-sixth examples, for any of the twenty-fifth examples, depositing a second metal over the first metal comprises placing an integrated heat spreader in contact with the first metal, wherein the integrated heat spreader comprises one or more layers of the second metal.

In twenty-seventh examples, for any of the twenty-sixth examples, depositing a first metal on a surface of an integrated circuit die comprises depositing gold, silver, or copper on the surface of the integrated circuit die.

In twenty-eighth examples, for any of the twenty-sixth examples, placing an integrated heat spreader in contact with the first metal comprises placing an integrated heat spreader comprising alternating layers of silver and sintering silver in contact with the first metal.

In twenty-ninth examples, for any of the twenty-sixth examples, bending the integrated heat spreader to place the integrated heat spreader in contact with lateral sides of the integrated circuit die.

In thirtieth examples, for any of the twenty-sixth examples, affixing the integrated circuit die to a surface of a package substrate.

In thirty-first examples, for any of the thirtieth examples, depositing the first metal on the surface of the package substrate.

In thirty-second examples, for any of the thirty-first examples, depositing sintering silver on the first metal on the surface of the package substrate and sintering the sintering silver to form a metallurgic junction between the sintering silver and the first metal on the surface of the package substrate.

In thirty-third examples, for any of the thirty-second examples, affixing the package substrate to a system board.

In thirty-fourth examples, for any of the thirty-third examples, affixing a lid to the system board, wherein the lid extends over the integrated heat spreader.

In thirty-fifth examples, an apparatus formed by any of the twenty-fifth through thirty-fourth examples.

In thirty-sixth examples, an integrated circuit device package comprises a package substrate; an integrated circuit die coupled with contacts on a surface of the package substrate; a first material layer comprising a first metal, the first material layer on a surface of the die, and extending at least between opposite lateral sides of the die; a second material layer comprising a second metal over the first material layer; and means for sintering between the first material layer and the second material layer, wherein there is a metallurgical junction between the means for sintering and the first metal and between the means for sintering and the second metal.

In thirty-seventh examples, for any of the thirty-sixth examples, the first material layer extending conformally on the lateral sides of the die.

In thirty-eighth examples, for any of the thirty-sixth through thirty-seventh examples, a third material layer comprising the first metal on the surface of the package substrate, wherein there is a metallurgical junction between the means for sintering and the first metal of the third material layer.

In thirty-ninth examples, for any of the thirty-sixth through thirty-eighth examples, the package substrate further comprises one or more supports extending orthogonally away from the surface of the package substrate, wherein a surface of the one or more supports comprises the first metal.

In fortieth examples, for any of the thirty-ninth examples, the one or more supports extend away from the surface of the package substrate beyond the surface of the die.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An integrated circuit device apparatus comprising:
   a die comprising an integrated circuit;
   a first material layer comprising a first metal, the first material layer on a surface of the die, and extending at least between opposite lateral sides of the die;
   a second material layer comprising a second metal over the first material layer, the second metal having a polycrystalline structure; and
   a third material layer comprising sintered silver particles and having a porosity greater than that of the second material layer, the third material layer between the first material layer and the second material layer, wherein the second and third material layers comprise two adjacent layers of a stack, the stack further comprising:
   two or more additional second material layers, each comprising the second metal; and
   each interleaved with additional third material layers, each of the additional third material layers comprising sintered silver particles and having higher porosity than the second material layers.

2. The apparatus of claim 1, wherein there is a metallurgical junction between a first of the silver particles and the first metal, or between a second of the silver particles and the second metal.

3. The apparatus of claim 1, wherein the third material layer has a porosity exceeding 20%.

4. The apparatus of claim 1, wherein the silver particles have a diameter less than 5 micrometers.

5. The apparatus of claim 1, wherein the third material layer comprises polymer resin interspersed among the silver particles.

6. The apparatus of claim 1, wherein the first material comprises at least one of silver, gold, or copper.

7. The apparatus of claim 1, wherein the second material layer comprises predominantly silver.

8. The apparatus of claim 1, wherein the second and third materials extend laterally beyond the opposite lateral sides of the die.

9. The apparatus of claim 1, wherein one of the additional third material layers is at a top of the stack opposite the first material layer.

10. The apparatus of claim 1, wherein a first of the additional third material layers between the additional second material layers has a first thickness, greater than a second thickness of the third material layer between the first and second material layers.

11. The apparatus of claim 10, wherein a thickness of the stack is between 300 um and 1000 um.

12. The apparatus of claim 10, wherein a thickness of each layer of the third material is between 15 um and 50 um.

13. The apparatus of claim 10, wherein a thickness of each layer of the second material is between 50 um and 300 um.

14. An integrated circuit device package comprising:
    a package substrate;
    an integrated circuit die coupled with contacts on a surface of the package substrate;
    a first material layer comprising a first metal, the first material layer on a surface of the die, and extending at least between opposite lateral sides of the die;
    a second material layer comprising a second metal over the first material layer, the second metal having a polycrystalline structure; and a third material layer comprising sintered silver particles and having a porosity greater than that of the second material layer, the third material layer between the first material layer and the second material layer, wherein there is a metallurgical junction between a first of the silver particles and the first metal, or between a second of the silver particles and the second metal, and wherein the second and third material layers comprise two adjacent layers of a stack, the stack further comprising:
  two or more additional second material layers, each comprising the second metal; and
  each interleaved with additional third material layers, each of the additional third material layers comprising sintered silver particles and having higher porosity than the second material layers.

15. The integrated circuit device package of claim 14, further comprising the first material layer extending conformally on the lateral sides of the die.

16. The integrated circuit device package of claim 14, further comprising a fourth material layer comprising the first metal on the surface of the package substrate, wherein there is a metallurgical junction between a third of the silver particles and the first metal of the fourth material layer.

17. The integrated circuit device package of claim 14, wherein the package substrate further comprises one or more supports extending orthogonally away from the surface of the package substrate, wherein a surface of the one or more supports comprises the first metal.

18. The integrated circuit device package of claim 17, wherein the one or more supports extend away from the surface of the package substrate beyond the surface of the die.

19. A computing system comprising:
  a system board;
  a memory coupled with the system board; and
  an integrated circuit device package coupled with the system board, the integrated circuit device package comprising:
    a package substrate;
    an integrated circuit device coupled with contacts on a surface of the package substrate;
    a first material layer comprising a first metal, the first material layer on a surface of the die, and extending at least between opposite lateral sides of the die; and
    an integrated heat spreader, the integrated heat spreader comprising:
      a second material layer comprising a second metal over the first material layer, the second metal having a polycrystalline structure; and
      a third material layer comprising sintered silver particles and having a porosity greater than that of the second material layer, the third material layer between the first material layer and the second material layer, wherein there are metallurgical junctions between a first of the silver particles and the first metal and between a second of the silver particles and the second metal, and wherein the second and third material layers comprise two adjacent layers of a stack, the stack further comprising:
        two or more additional second material layers, each comprising the second metal; and
        each interleaved with additional third material layers, each of the additional third material layers comprising sintered silver particles and having higher porosity than the second material layers.

20. The system of claim 19, further comprising a fourth material layer comprising the first metal on the surface of the package substrate, wherein there is a metallurgical junction between a third of the silver particles and the first metal of the fourth material layer.

21. The system of claim 19, wherein one of the additional third material layers is at a top of the stack opposite the first material layer.

22. The system of claim 19, wherein the package substrate further comprises one or more supports extending orthogonally away from the surface of the package substrate, wherein a surface of the one or more supports comprises the first metal.

23. The system of claim 19, further comprising a lid over the die and the integrated heat spreader, the lid adhered to the system board.

* * * * *